United States Patent [19]
Jakob et al.

[11] Patent Number: 5,683,040
[45] Date of Patent: Nov. 4, 1997

[54] METHOD FOR RECYCLING WASTE FROM PRINTED CIRCUIT BOARD ASSEMBLIES FROM ELECTRICAL AND ELECTRONIC DEVICES

[75] Inventors: Ralf Jakob, Riedleinweg; Michele Melchiorre, Blaustein, both of Germany

[73] Assignee: Daimler-Benz AG, Stuttgart, Germany

[21] Appl. No.: 650,713

[22] Filed: May 20, 1996

[30] Foreign Application Priority Data

May 18, 1995 [DE] Germany .................. 195 18 277.4

[51] Int. Cl.$^6$ .................................................. B02C 19/12
[52] U.S. Cl. .................... 241/14; 241/23; 241/24.14; 241/29; 241/DIG. 37; 241/DIG. 38
[58] Field of Search .................... 241/14, DIG. 37, 241/DIG. 38, 29, 80, 97, 79.1, 73, 23, 24.13, 24.14

[56] References Cited

U.S. PATENT DOCUMENTS

| 4,020,992 | 5/1977 | Binger et al. |
|---|---|---|
| 5,139,203 | 8/1992 | Alavi ................... 241/DIG. 38 |
| 5,217,171 | 6/1993 | Feldman ................ 241/DIG. 38 |
| 5,456,738 | 10/1995 | Gil ..................... 241/DIG. 37 |

FOREIGN PATENT DOCUMENTS

| 0 403 695 | 12/1990 | European Pat. Off. |
|---|---|---|
| 30 02 227 | 6/1988 | Germany . |
| 288260 | 3/1991 | Germany ............. 241/DIG. 38 |
| 42 13 274 | 10/1993 | Germany . |
| 43 29 476 A1 | 3/1995 | Germany . |
| 43 37 294 | 5/1995 | Germany . |
| 2218486 | 8/1990 | Japan ................. 241/DIG. 38 |

*Primary Examiner*—Mark Rosenbaum
*Attorney, Agent, or Firm*—Evenson, McKeown, Edwards & Lenahan P.L.L.C.

[57] ABSTRACT

The invention relates to a method for recycling electronic waste in the form of disassembled printed circuit boards from electronic devices, from which the components have not been removed, known as printed circuit boards. After removal of the batteries, mercury switches and PCB-containing capacitors, the printed circuit boards are mechanically precomminuted and the particles are cryogenically embrittled with liquid nitrogen and comminuted in a hammermill. In order to obtain a higher purity of the recovered metal concentrates and, conversely, a lower metal content of the concentrated residue materials as well as less emission during recycling and a simpler process, the cryogenically embrittled particles are selectively comminuted batchwise in a hammermill, wherein the ground material is divided into a fine fraction, emerging from a sieve at the bottom of the grinding chamber, and a coarser metallic fraction, which can be discharged batchwise and from which iron particles can subsequently be magnetically removed. The fine fraction is sorted into several narrow-band size classes with a particle size of about 1:1.6 per size class. Each individual size class of particles can be separately separated with corona-roller separators into residue material particles and metal particles. The latter can then be divided into different metal classes.

17 Claims, 1 Drawing Sheet

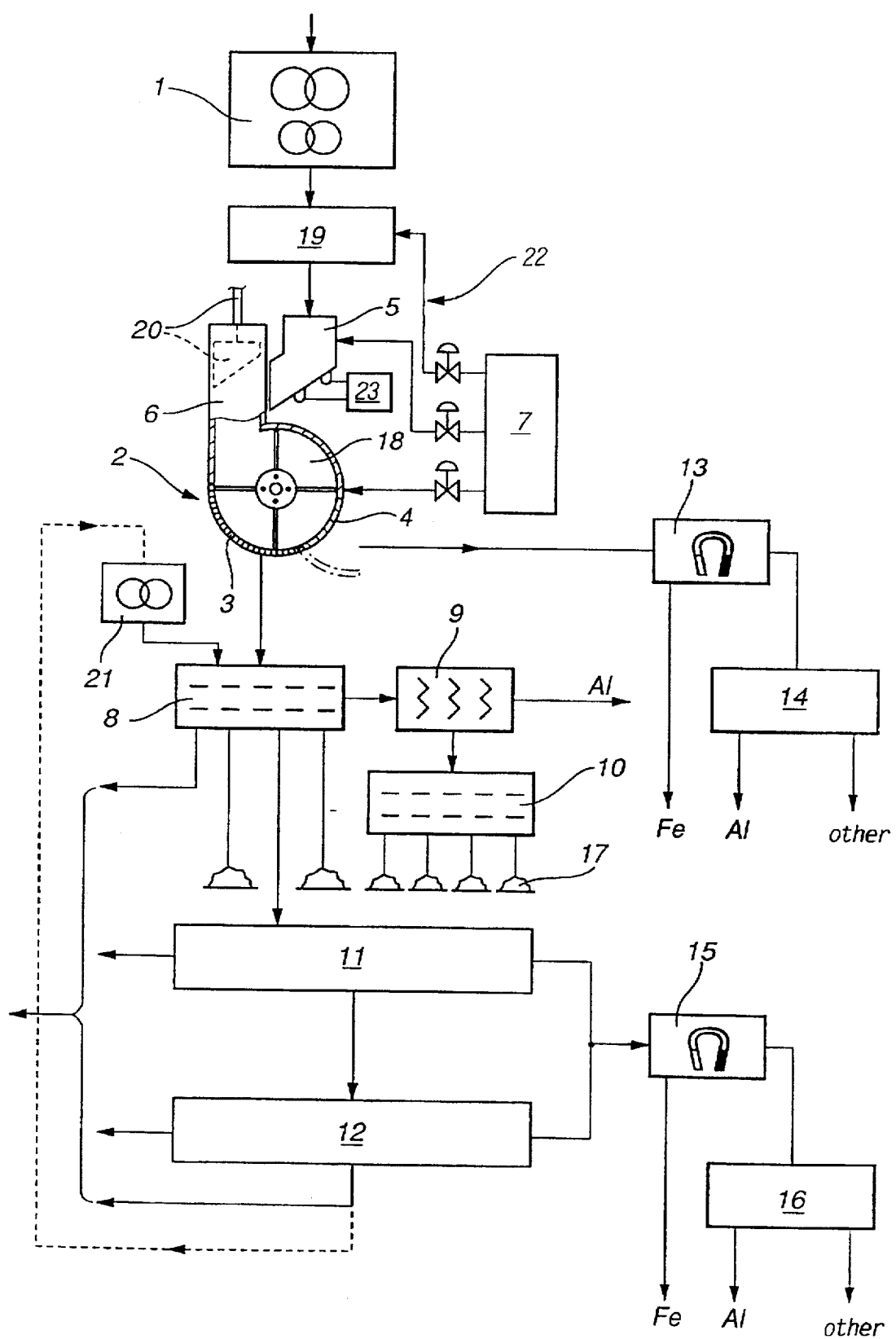

METHOD FOR RECYCLING WASTE FROM PRINTED CIRCUIT BOARD ASSEMBLIES FROM ELECTRICAL AND ELECTRONIC DEVICES

BACKGROUND AND SUMMARY OF THE INVENTION

The present invention relates to a method for recycling waste found in the form of disassembled circuit boards from electric or electronic devices that are still equipped with electronic components, hereinafter referred to as "printed circuit boards", as described for example in K. O. Tiltmann "Recycling betrieblicher Abfälle" (Recycling Industrial Waste), loose-leaf edition, July 1991, WEKA Fachverlag Kissingen 1990.

Generally, printed circuit board assemblies have complex, composite structures, which is a significant recycling problem. In the case of printed circuit board assemblies, valuable materials and contaminants are found very close to one another and must be processed separately for utilization or disposal. Metals such as copper, iron, tin and lead are regarded as valuable materials found in printed circuit board assemblies. Furthermore, noble metals such as gold, silver and palladium are found in worthwhile amounts, especially in high grade printed circuit board assemblies.

However, halogen-containing, fire-retardant residues which are frequently reinforced with glass fibers, constitute the highest proportion by weight (approximately 50%) found in printed circuit board assemblies. When these residues are treated thermally, the danger exists that dioxins and furans will form. Therefore, for ecological and economic reasons, the metal and residue fractions must be of high purity for separate utilization and disposal, which can only be achieved by extensive disintegration of the composite.

A good electronic waste recycling method must recover residue with a low metal content, recover metals free of residue and furthermore separate the metals with sufficient purity into iron, aluminum and other metals. From a mixture of nonferrous metals which predominantly contains copper, companies specializing in metallurgy can isolate not only the copper, but also other metals such as zinc, lead, silver, gold or platinum by recognized methods and concentrate or refine these metals to a high degree of purity. However, none of the methods currently used for recycling printed circuit board assemblies are environmentally friendly.

The methods most frequently used to recycle printed circuit board waste are mechanical. Generally, before recycling, it is necessary to remove contaminants such as batteries, mercury switches, PCB-containing capacitors, etc. from the printed circuit boards in order to prevent contamination of the valuable material fractions. However, this step is sometimes skipped. The printed circuit boards are then comminuted in several steps, usually by using twin-shaft cutters, hammermills and/or granulators. Iron metal is removed from the comminuted printed circuit board waste with magnetic separators. The material is then generally classified in order to separate the metals from the residues by mechanical and/or physical means such with an air-flattening furnace or electrostatic precipitators. Some of the individual valuable materials are separated from the residues by flotation or dense medium methods which, however, cause effluent problems. Eventually, the metal fractions are sold, while the residue material and the dust which is produced during comminution must be disposed of as hazardous waste because of their contaminant content.

In a method described in F. Ambrose and B. W. Dunning "Accomplishments in Waste Utilization", 7th Mineral Waste Utilization Symposium, Chicago, Oct. 20–21, 1980, Washington: US Department of the Interior, Bureau of Mines, military electronic waste in the form of complete switch cabinets which have not been disassembled, entire devices and also individual circuit boards, are recycled. The waste is comminuted in several steps with different devices and selection of the particles on the basis of material takes place after each comminuting step. Iron particles are separated magnetically and aluminum particles are removed by an electric eddy current separation. In the case of smaller particles, a mixture of metal and residue particles can be separated by a roller-corona separator. The resulting cables are removed from the particle mixture by suitable methods, subjected to a separate treatment and can be separated as such into copper and plastic materials. The end products of this method are iron, copper, aluminum, other metals and metal-contaminated residues. The metals, if necessary after being refined, can be used again as raw materials. The noble metals can be recovered by hydrometallurgical processes in refineries. The residue materials generally have no further use. Unless combustion, utilization as a carbon donor in ore smelting or hydrogenation are considered, the remaining residue materials must be disposed of as hazardous waste.

In another method described in Tiltmann (see above), insulated circuit boards which have been taken out of devices, are initially comminuted in a double-shaft cutter to a particle size smaller than about 30 mm. From the resulting mixture, the iron particles are removed with a magnetic separator. The remaining residue is cooled with liquid nitrogen to about −130° C. to make the plastic parts brittle. The cooled waste is ground in a continuous hammermill and comminuted into fine particles. The granulate is separated in a vibrational separator into a residue fraction and a metal fraction. The resulting dust is collected and sent to a refinery to refine the noble metals contained therein. The metal fraction is sent to a copper smelting plant to refine the copper and at the same time, the noble metals contained in the metal fraction is obtained as an anode sludge, from which the noble metals can also be recovered in a refinery. As a rule, the residue fraction has no further use as a valuable material.

However, the composite material is not adequately disintegrated by the methods currently used. Moreover, the separating equipment used does not achieve a satisfactory separation. As a result, the metal fraction still contains a relatively high proportion of residue material and therefore of halogens, which leads to the formation of dioxins and furans during the subsequent smelting of the metals. This in turn decreases the profits obtained from the recovered metals.

Additionally, the residue fraction which must be disposed of still contains about 10 to 20% of metals, which if a thermal treatment is used, can decrease the effect of the catalysts used during gas treatment.

It is an object of the present invention to improve the basic recycling method used for printed circuit board waste in order to achieve the following advantages:
- a higher purity of the recovered metal concentrates, and conversely
- a lower metal content in the residue material,
- less emissions during the recycling and
- a simpler engineering process.

These and other objectives are achieved by the present invention by providing a method for recycling printed circuit boards comprising the steps of:

1) removing contaminants such as batteries, mercury switches and PCB-containing capacitors from the printed circuit boards, and separating, collecting and disposing of these components, 2) mechanically precomminuting the printed circuit boards to a fragment not larger than 30 mm,
3) cryogenically embrittling the precomminuted particles, by cooling with a liquefied gas, preferably with liquid nitrogen,
4) comminuting the cryogenically embrittled particles in a hammermill,
5) separating the fragments into ferrous metals, nonferrous metals and residues, wherein
   a) the cryogenically embrittled particles are selectively comminuted batchwise in a hammermill, the ground material being selectively comminuted into a fine fraction which emerges from a grinding chamber through the bottom of a sieve and a coarser fraction of materials, the metallic material, which remain ductile in the cryogenic state, which remain behind in the grinding chamber and can be separately discharged batchwise,
   b) the fine fraction is sorted into several, narrow-band size classes with a grain-size band width of about 1:1.16 per size class,
   c) aside from a dust fraction with a particle size below about 0.1 mm, each individual size class of particles is divided separately with electrostatic precipitators into metal particles and residue material particles,
   d) the metal fractions from the selective comminution step and those from the electrostatic separation are divided into different metal classes.

An essential step in the process of the present invention is the selective comminution of the cryogenically embrittled circuit board fragments in a batch-operated hammermill, as a result of which an important selection into metal (the coarse fraction) and a metal/residue granulate (the fine fraction) is accomplished. As a result, the bulk of the metals can initially be isolated from the particle mixture. The further separation of the fine fraction into metal and residue by an electrostatic method of separation is preferred in view of the closely stepped size classification of the particles, because the electrostatic method of separation is comparatively more precise when the particles have approximately the same particle size.

Other objects, advantages and novel features of the present invention will become apparent from the following detailed description of the invention when considered in conjunction with the accompanying drawing.

BRIEF DESCRIPTION OF THE DRAWINGS

The sole drawing figure is a schematic flow chart representing a preferred embodiment of the present invention.

DETAILED DESCRIPTION OF THE PREFERRED EMBODIMENTS

According to a preferred embodiment, printed circuit boards, still equipped with functional electronic components but free of contaminants such as batteries, mercury switches, PCB capacitors or the like, are subjected to a preliminary comminution step in a two-shaft or four-shaft cutter (1) to a size of about 20 mm. The precomminuted printed circuit boards are cooled in a cooling apparatus (19) with liquid nitrogen. The nitrogen is stored in an insulated reservoir (7), from which several controllable cooling liquid pipelines (22) branch off. By cooling the particles with liquid nitrogen to a temperature of −100° C. to −170° C., the residues are embrittled and thermal stresses, which favor the subsequent disintegration during the comminution, are produced in the composite.

After cooling, the material is selectively comminuted in a hammermill (2), the temperature in the grinding chamber (18), contrary to the tendency of material being ground to warm up because of the grinding energy, is kept constant by feeding additional liquid nitrogen into the grinding chamber (18) through controllable cooling liquid pipelines (22).

The residue materials are selectively comminuted because of their lower fracturing resistance. Accordingly, a fine fraction is formed which contains the plastic materials, the glass fibers, the glass fragments, the ceramic particles and small metal particles. This fraction is continuously drawn off from the grinding space through the stationary sieve bottom (3) of the grinding chamber which has holes with a diameter of about 4 mm. When the disintegration of the material is complete, the coarse sieve residue consists only of metals and is transferred out of the grinding space batchwise through a discharging shutter (4).

Applicant's German Patent Application No. 195 07 958.2, filed Mar. 7, 1995, filed as U.S. patent Ser. No. 08/612,287 on Mar. 7, 1996 discloses a hammermill which has been structurally optimized to perform a selective comminution. Selective comminution with a hammermill can be advantageously used in the process of the present invention because the heterogeneous material being ground, namely the ductile metals and the artificially embrittled plastic materials, contain components having quite different mechanical properties or grinding resistance. Of these, the weaker components can be selectively comminuted by selecting and optimizing treatment parameters such as the rpm of the rotor and/or the treatment time.

The hammermill (2) disclosed in German Patent Application No. 195 07 958.2 provides a side filling shaft (6) with a feeding funnel (5) of a feeding scale (23). The funnel permits a defined, method-optimized amount to be fed into the mill. After the previous charge has been emptied from the grinding chamber (18), a new weighed batch is quickly pushed into the grinding chamber with the aide of a moveable plunger (20) found in the filling shaft (6). As such, it is possible, as it is important for the selective comminution action, to maintain short and accurately reproducible treatment times and to fill the mill constantly to the same level for operation. The material in the feeding funnel (5) can also be kept cool with liquid nitrogen fed through controllable cooling liquid pipelines (22).

The coarse fraction from the hammermill (2), which is removed batchwise by the emptying shutter (4), is passed over a magnetic separator (13) in order to remove ferrous metals. The remaining non-ferrous metal fraction can be additionally fed to an electric eddy current separator (14) to separate aluminum.

The fine material constantly emerging from the sieve bottom (3) of the hammermill (2), not only contains predominately different plastic material, glass and ceramic particles, but also metal particles of different types. The mixture can be separated into its metal and residue material components by electrostatic separation. It was observed that the accuracy of the separation of such methods can be significantly increased if the spectrum of particle sizes of the particle mixture fed to the electrostatic separator is narrow. For this reason, the fine fraction emerging from the selective comminution step, is sorted into a spectrum of narrow-band size classes, with a particle size band width of about 1:1.6 per size class, through two different screening machines (8) and (10).

In an experiment carried out according to the present invention, the following screen fractions, which were classified in the first screening machine (8), were selected for the further recycling:

smaller than 0.1 mm
from 0.1 to 0.25 mm,
from 0.25 to 0.4 mm,
from 0.4 to 0.63 mm and
larger than 0.63 mm.

The smallest particle fraction (smaller than 0.1 mm), which is dust, is disposed of in a suitable manner without being processed further.

The largest particle fraction (larger than 0.5 to 0.8 mm, preferably larger than about 0.63 mm) in this preclassification contains aluminum foil from capacitors, which makes further recycling of this fraction difficult. The foil is therefore removed as a light weight fraction with an air separator such as a zigzag separator (9).

The heavy fraction from the zigzag separator (9) is then classified into different fractions by a second screening machine (10). In an experiment carried out according to the present invention, the following screen fractions, which were classified in the second screening machine (10), were selected for further recycling:

from 0.63 to 1.0 mm,
from 1.0 to 1.6 mm,
from 1.6 to 2.5 mm and
larger than 2.5 mm (up to about 4 mm).

The fractions from the two screening machines (8) and (10) are segregated for each particle size classification in order to separate the metal from the plastic by passing the segregated particles batchwise over an electrostatic separator. In the example shown in the single drawing figure, the electrostatic separator is a two-step corona-roller separator with two separating steps (11) and (12). In order to selectively feed each particle size into the corona-roller separator, the individual particle size fractions are provisionally stored in separate bunkers (17), each of which is provided with an automatic level monitor. The particles are automatically supplied to the first step (11) of the electrostatic separator from the first bunker to fill up, wherein the operating parameters in the separating steps in each case are automatically optimally adjusted to correspond to the respective particle size being run.

In the single drawing figure, steps (11) and (12) of the corona-roller separator are depicted as rectangles, wherein the metal fraction is drawn off to the right in the diagram and the residue fraction is drawn off to the left in the diagram. The mixed fraction formed in the first step (11), is fed to the second step 12 (see mass flow arrow downward) and separated again. Depending on the purity and amount, the mixed fraction of the second step (12) is either added to the residue fraction or comminuted further by a granulator (21) and again supplied to the first screening machine (8) to be reprocessed.

In the case of the current corona-roller separator, the results are difficult to reproduce due to fluctuations in the surrounding conditions (temperature, humidity) and the moisture content of the material. The moisture content of the material has a decisive effect on conductivity and therefore on the separation results. In order to keep the conductivity differences between the metal and the residue material optimally high and moreover, as constant as possible, and thus to optimize the accuracy of the separation with the electrostatic separator, the material supplied to the corona-roller separator according to the present invention, is heated to constant working conditions, namely temperature and dryness. This heating can be accomplished by radiant heaters for example. In this regard, it should be noted that the highly cooled particles emerging from the selective comminution step, condense water from the surrounding air and retain this moisture. In addition, the conductivity of the air surrounding the charged segment affects the charge transfer from the corona electrode to the surface of the particles. The conditions surrounding the corona-roller separator are therefore kept constant by controlling the temperature and humidity of the surrounding air. This also contributes to an optimization of the accuracy of the separation of the electrostatic process.

The metal fractions, deposited at the two steps (11, 12) of the corona-roller separator, are supplied to a magnetic separator (15), in order to separate ferrous metals. It is noted that the magnetic separation of iron particles is less sensitive to particle size differences. However, if the particles have already been classified according to size, the magnetic separation of the iron particles will also be carried out separately for the different particle sizes and with parameters optimally adjusted for the particle size. The magnetic separation of iron metals can also be followed here once again by a separation of aluminum by means of an electric eddy current separator (16). In a similar fashion, the eddy current separation of the aluminum particles functions better with closely classified particle mixtures and parameters optimized for the particular particle size than with widely scattered particle mixtures and a universal adjustment of the parameters.

The iron particles, separated at the magnetic separators (13, 15), can be jointly passed to a steel manufacturer. Experience has shown that the iron particles from electronic waste contain so little, if any, noble metals, that an extraction is not worthwhile. The aluminum, separated at the two electric eddy current separators (14, 16), can be sold to an aluminum smelter. Currently, the plastic material and the dust must still be disposed of.

Aluminum foil with a relatively high content of plastic materials is obtained from the zigzag separator (9). Currently, such contaminated aluminum is not accepted by aluminum smelters. This aluminum foil, which originates from wrapped capacitors, is obtained in very small amounts percentage-wise, such that an expensive recycling process is hardly worthwhile.

The method of the present invention offers significant advantages over the methods previously described.

A greater purity of the recovered metal concentrates can be achieved because of the improved material disintegration. Due to the high purity, higher profits can be achieved for recovered iron and non-ferrous metals. Moreover, due to the small proportion of residue materials, the emission of pollutants (dioxins and furans) is minimized during the smelting of the metals.

Previous investigations have shown that the metals present in the residue material fraction, which consists essentially of plastic materials, clearly reduce the service life and the effect of catalysts used for thermal treatment. According to the present invention, residual materials with a very low metal content are obtained.

According to the process of the present invention, the low temperatures during the selective comminution process also prevent the formation of pollutants, such as dioxins and furans. Moreover, previous investigations show that the incidence of dust, as well as the annoyance caused by bad odors, can be clearly reduced to values below those achieved with current methods. Additionally, wet methods with effluent problems are avoided.

The present method has fewer comminuting steps than the methods of the state of the art. Furthermore, only simple process techniques which can be reliably controlled are used. Due to the simplified engineering process, the investment costs, as well as, with the exception of the liquid nitrogen for cooling, the operating and maintenance costs arising for the operation of such a process and required for the proper recycling of electronic waste are kept low, so that the disposal costs for the electronic waste are kept within justifiable boundaries. The relatively high operating costs for cooling with nitrogen are, however, more than compensated for by the higher proceeds from selling the metals, which can be achieved due to the improved purity. Therefore, in addition to the ecological advantages, the method of the present invention is also economically advantageous.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. A method for recycling printed circuit boards from electric or electronic devices comprising the steps of:
   a) removing, separating and disposing of components containing contaminants from the printed circuit boards,
   b) mechanically precomminuting the printed circuit boards to obtain precomminuted particles of a size of not more than 30 mm,
   c) cryogenically embrittling the precomminuted particles by cooling with a liquefied gas to obtain cryogenically embrittled particles,
   d) comminuting the cryogenically embrittled particles in a hammermill to obtain fragments,
   e) separating the fragments into ferrous metals, nonferrous metals and residues,
   wherein
   the cryogenically embrittled particles are selectively comminuted batchwise in a grinding chamber of the hammermill into a fine fragment fraction emerging from the grinding chamber through a sieve at the bottom of the grinding chamber and a coarser fragment fraction of metallic material particles which remain ductile in a cryogenic state and remain in the grinding chamber to be separately discharged batchwise,
   the fine fraction is sorted into several, narrow-band size classes with a particle-size band width of about 1:1.16 per size class,
   each individual size class of particles, except for a dust fraction with a particle size of less than 0.1 mm, is separately divided by electrostatic precipitators into metallic material particles and residue material particles, and
   the metallic material particles from the selective comminution step and those from the electrostatic separation step are divided into different metal classes.

2. The method of claim 1, wherein the components containing contaminants are batteries, mercury switches and PCB-containing capacitors.

3. The method of claim 1, wherein the liquified gas is liquid nitrogen.

4. The method of claim 1, wherein the fine fraction emerging from the selective comminution step has a particle size of less than about 4 mm.

5. The method of claim 1, wherein the step of comminuting the cryogenically embrittled particles further comprises the step of cooling the grinding chamber by introducing liquefied gas into the grinding chamber.

6. The method of claim 1, wherein the fine fraction emerging from the selective comminution is sorted into size classes according to the following dimensions:

smaller than 0.1 mm, treated as dust
0.1 to 0.25 mm,
0.25 to 0.40 mm,
0.40 to 0.63 mm,
0.63 to 1.0 mm,
1.0 to 1.6 mm,
1.6 to 2.5 mm and
2.5 to 4.0 mm.

7. The method of claim 1, wherein prior to completely sorting the fine fraction, particles with sizes larger than 0.5 to 0.8 mm are preclassified from the selective comminution step and are sorted to separate out small pieces of metal foil.

8. The method of claim 7, wherein the preclassification step includes preclassifying particles larger than about 0.63 mm.

9. The method of claim 7, wherein the small pieces of metal foil are sorted in a zigzag separator.

10. The method of claim 1, wherein the electrostatic separation step comprises the step of maintaining the particles at a constant temperature and moisture content by indirectly heating the particles prior to the electrostatic separation step.

11. The method of claim 1, wherein the electrostatic separation step comprises the step of controlling and maintaining the temperature and humidity of air surrounding the particles during the electrostatic separation step at a constant temperature and humidity.

12. The method of claim 1, wherein the step of electrostatically separating the particles in the individual size classes into residue material particles and metallic material particles comprises the step of separating the particles with a corona-roller separator.

13. The method of claim 1, wherein the step of electrostatically separating the particles in the individual size classes into residue material particles and metallic material particles comprises the steps of
separating the particles in two steps with a corona-roller separator adjusted to different operating parameters, the two steps of the corona-roller separator being adjusted for i) a fraction which is electrically conductive to separate out metallic material particles, ii) a fraction of residue material particles which is not conductive, and iii) a mixed fraction, wherein only the mixed fraction of the first separation step is passed onto the second separation step for further separation.

14. The method of claim 13, comprising the step of adding the mixed fraction of the second separation step to the residue material particles.

15. The method of claim 13, comprising the step of returning the mixed fraction of the second separation step to the recycling method after a further comminution and before classification into particle sizes.

16. The method of claim 1, comprising the further steps of
magnetically removing magnetizable metals from the coarser fraction of metallic material particles of the selective comminution step and
removing aluminum particles with an electric eddy current separator.

17. The method of claim 1, comprising the further steps of
magnetically removing magnetizable metals from the metallic materials particles of the electrostatic separation step and
removing aluminum particles with an electric eddy current separator.

* * * * *